United States Patent [19]

Nishikata et al.

[11] Patent Number: 5,432,124
[45] Date of Patent: Jul. 11, 1995

[54] METHOD OF MANUFACTURING COMPOUND SEMICONDUCTOR

[75] Inventors: Kazuaki Nishikata; Yuji Hiratani; Michinori Irikawa, all of Yokohama, Japan

[73] Assignee: The Furukawa Electric Co., Ltd., Tokyo, Japan

[21] Appl. No.: 268,526

[22] Filed: Jul. 6, 1994

[30] Foreign Application Priority Data

Jul. 6, 1993 [JP] Japan .................................. 5-166932

[51] Int. Cl.6 ........................................... H01L 21/20
[52] U.S. Cl. ..................... 437/133; 437/104; 437/105; 437/107; 437/129; 117/90
[58] Field of Search ............... 437/104, 105, 107, 129, 437/133; 117/90

[56] References Cited

FOREIGN PATENT DOCUMENTS

| 0192321 | 9/1985 | Japan | 437/133 |
| 0190328 | 8/1988 | Japan | 437/133 |
| 0022814 | 1/1990 | Japan | 437/133 |

OTHER PUBLICATIONS

Giannini, C. et al, "Analysis of epitaxial $Ga_xIn_{1-x}As$/InP and $Al_yIn_{1-y}As$/InP Interface region by high resolution x-ray diffraction", Appl. Phys., Lett. 62 (2), 11 Jan. 1993.

Primary Examiner—R. Bruce Breneman
Assistant Examiner—Ramamohan Rao Paladugo
Attorney, Agent, or Firm—Jacobson, Price, Holman & Stern

[57] ABSTRACT

There is provide a method of manufacturing a compound semiconductor (MBE) that can make the substrate surface of the semiconductor highly clean and plane so that no impurity may be left between the substrate surface and the grown crystal layer. In the step of cleaning a substrate with MBE, the substrate surface is irradiated with V molecular beams that cannot be significantly deposited out of molecular beams to be used for the crystal growth step, said V molecular beams being irradiated under a condition of $P_1 \leq (P_2 \times \frac{1}{2})$, where $P_1$ is the pressure of V molecular beams and $P_2$ is the pressure of molecular beams in the crystal growth step and the temperature of the substrate surface is raised by heating until stabilized group III surfaces appear on the substrate surface. A very cleanand smooth substrate surface can be obtained with such an arrangement. Harmful impurities can be completely eliminated from the interface of the substrate and the crystal. The formation of a buffer layer can be effectively prevented in the initial stages of crystal growth. In short, high-quality compound semiconductors can be produced on a reliable basis.

6 Claims, 1 Drawing Sheet

METHOD OF MANUFACTURING COMPOUND SEMICONDUCTOR

BACKGROUND OF THE INVENTION

1. Field of the Invention

This invention relates to a method of manufacturing a compound semiconductor by means of the molecular beam epitaxy (MBE).

2. Prior Art

The molecular beam epitaxy is widely used for manufacturing compound semiconductors.

As is known well, the MBE is a technique with which atoms of one or more than one components of the crystal of a semiconductor material are caused to hit a substrate as molecular beams in order to make the crystal grow on the substrate.

A very thin single crystal film can be made to grow in situ with MBE by controlling the composition of the crystal. Particularly, the crystal growth of a compound semiconductor can be realized on an atomic layer basis to produce semiconductor crystal having an evenly and finely distributed composition, if molecular beams of different kinds are fed to the substrate simultaneously in an highly controlled manner. This technique proves to be very advantageous in producing quantized devices.

Quantized devices produced by forming crystal of a semiconductor substance such as InAlAs, InGaAs or InGaAlAs on a substrate of a III-V compound, using MBE seem to be very promising, if they are used for semiconductor laser devices, photosensors and high-speed transistors.

Some of the requirements to be met in order to make high quality semiconductor crystal grow steadily and stably on a substrate of a III-V compound by means of MBE include a reduced transient in the intensity of molecular beams, a stabilized As pressure to be realized by controlling the back pressure and a clean substrate surface in a high vacuum atmosphere.

Therefore, the process of producing compound semiconductors with MBE typically involves a substrate cleaning operation.

In such a substrate cleaning operation, the substrate is most usually heated in order to remove impure substances from the surface of the substrate. However, the V group component of the substrate that can produce high-vapor pressure can also move away from the substrate during the operation to degrade the substrate surface and make the latter unsuitable for growing crystal.

A measure that has been proposed and is currently used to prevent the V group component from moving out of the substrate is evaporation of molecular beams of V molecules that do not significantly settle by themselves on the substrate, while heating the substrate surface.

For instance, an InP substrate is evaporated with As molecular beams to prevent P from leaving the substrate, while heating the substrate surface.

PROBLEMS TO BE SOLVED BY THE INVENTION

The parameters involved in the operation of cleaning a substrate with MBE include the substrate temperature, the cleaning time and the pressure of V molecular beams applied to the substrate surface. Unless correct values are selected for these parameters, it is difficult to obtain a flat and thoroughly clean substrate surface. Therefore, selection of correct values for the parameters is vital for the operation of forming quality crystal on a reliable basis.

However, there have not been any thorough and extensive studies on the pressure of V molecular beams evaporated onto the substrate surface that justify the above described preventive measure against the V group component leaving the substrate, where the pressure of V molecular beams to be evaporated on the substrate for the cleaning operation is made substantially equal to that of V molecular beams used for the crystal growth operation.

Technological documents discussing the pressure of V molecular beams for cleaning substrates include Japanese Patent Laid-open Application No. 4-274315.

Concerning the invention disclosed in the above patent application, the inventors propose to maintain the pressure of As molecular beams to be evaporated on an InP substrate to $4 \times 10^{-5}$ Torr which is higher than the pressure good for crystal growth, or $2 \times 10^{-5}$ Torr, in order to effectively prevent P from moving out of the substrate while heating the substrate as hot as 540° to 595° C. during the operation of cleaning the substrate surface.

Thereafter, at the beginning of the subsequent crystal growth process, a relatively low pressure of $2 \times 10^{-5}$ Torr is used for the evaporation of As molecular beams.

With the technique disclosed in the above patent document, however, the substrate is apt to be seriously damaged as it is exposed to high temperature as correctly pointed out in the document listed below. Additionally, since a buffer layer is formed with a different ratio of the crystal components on the interface between the substrate and the crystal, the produced compound semiconductor does not have a steep potential barrier which is necessary to provide the crystal with excellent electric characteristics.

Document: C. Giannini et al., Appl. Phys. Lett. 62, pp. 149, 1993

Japanese Patent Laid-open Applications Nos. 60-58613 and 4-122731 also disclose respective techniques of weakly evaporating onto the oxide film of a compound semiconductor with III molecular beams in order to change the composition of the oxide and make it easy for it to move away from the substrate at low temperature.

While these techniques are effective for inducing the oxide of the thin film on the substrate to leave the device at low temperature, the evaporation of III atoms such as In atoms onto the substrate where polycrystal of the oxide is deposited can give rise to an irregular deposition of In atoms. If the surface of the substrate is made of a III compound, it can easily lose its smoothness when evaporated with III atoms.

OBJECT OF THE INVENTION

In view of the above identified technological problems of the conventional molecular beams epitaxy (MBE), it is therefore an object of the present invention to provide a method of manufacturing a compound semiconductor that can make the substrate surface of the semiconductor highly clean and plane so that no impurity may be left between the substrate surface and the grown crystal layer. With such a method, high-quality compound semiconductors can be manufactured on a highly reliable basis.

SUMMARY OF THE INVENTION

According to an aspect of the invention, the above object is achieved by providing a method of manufacturing a compound semiconductor comprising steps of cleaning the surface of a substrate of a III-V compound by heating it and evaporating it with molecular beams in a high vacuum atmosphere and depositing and growing crystal of a semiconductor substance on the surface of the substrate by evaporating onto the substrate with molecular beams containing component atoms of the semiconductor crystal to be formed in a high vacuum atmosphere, characterized in that the temperature of the substrate surface is raised by heating until stabilized group III surfaces appear on the substrate surface in said substrate cleaning step and that the substrate surface is evaporated in said substrate cleaning step with V molecular beams that cannot be significantly deposited are used out of molecular beams to be used for the crystal growth step, said V molecular beams being evaporated under a condition of $P_1 \leq (P_2 \times \frac{1}{2})$, where $P_1$ is the pressure of V molecular beams and $P_2$ is the pressure of molecular beams in the crystal growth step.

Said irradiation of V molecular beams onto the substrate surface may be started when the substrate is at room temperature but normally it is started when the V group component starts leaving the substrate to obtain a satisfactory result. If the substrate is made of InP, the irradiation of V molecular beams may be started when the temperature of the substrate is approximately 200° C., because P does not leave the substrate in a high vacuum atmosphere until the substrate is heated to approximately 200° C.

Note that the above described condition under which the evaporation of V molecular beams is conducted holds true throughout the following description of the present invention.

Preferably, the surface temperature of the substrate is held under a condition of $T_2 \leq T_1 \leq (T_2 + 50° C.)$ in said substrate cleaning step while the substrate surface is irradiated with V molecular beams after the appearance of a group III stabilized surfaces on the substrate surface, where $T_1$ is the surface temperature of the substrate and $T_1$ is the transition temperature of the group V stabilized surfaces to the group III stabilized surfaces.

Preferably, said substrate is an InP substrate and the surface temperature of the substrate is raised until the group III stabilized surfaces appear on the substrate surface in said substrate cleaning step, while evaporating onto the substrate surface with molecular beams containing As atoms and held to a pressure of $1 \times 10^{-5}$ to $1 \times 10^{-7}$ Torr.

Molecular beams containing As to be used for said evaporation is preferably held to a pressure of $1 \times 10^{-5}$ to $1 \times 10^{-7}$ Torr.

Alternatively, the surface temperature of the substrate is held under a condition of $T_2 \leq T_1 \leq (T_2 + 50° C.)$ in said substrate cleaning step while the substrate surface is irradiated with V molecular beams containing As atoms and held to a pressure of $1 \times 10^{-5}$ to $1 \times 10^{-7}$ Torr after the appearance of III stabilized planes on the substrate surface.

According to another aspect of the invention, there is provided a method of manufacturing a compound semiconductor comprising steps of cleaning the surface of a substrate of a III-V compound by heating it and eavaporating onto it with molecular beams in a high vacuum atmosphere and depositing and growing crystal of a semiconductor substance on the surface of the substrate by evaporating onto the substrate with molecular beams containing component atoms of the semiconductor crystal to be formed in at high vacuum atmosphere, characterized in that the temperature of the substrate surface is raised by heating under a condition of $T_5 \leq T_1 < T_4$ in said cleaning step, where $T_1$ is the surface temperature of the substrate and $T_2$ and $T_4$ are the temperatures at which group V and III stabilized surfaces appear respectively, and the substrate surface is evaporated onto with III molecular beams of III atoms as a component of the substrate after the appearance of the group V stabilized surfaces on the substrate semiconductor and before the appearance of III stabilized planes.

For the purpose of the present invention, III molecular beams are evaporated typically for one to several seconds.

Preferably, said substrate is an InP substrate and the substrate surface is evaporated onto with molecular beams containing As atoms and held to a pressure of $1 \times 10^{-5}$ to $1 \times 10^{-7}$ Torr while raising the surface temperature of the substrate until V stabilized planes appear on the substrate surface in said substrate cleaning step, followed by evaporation of molecular beams containing In atoms onto the substrate surface before the appearance of group III stabilized surface on the substrate surface while raising the surface temperature until the appearance of the group III stabilized surfaces on the substrate surface.

FUNCTION

The present invention was made by the inventors after a series of intensive studies and experiments on possible methods of manufacturing a compound semiconductor by means of molecular beams epitaxy (MBE).

More specifically, the following technological conclusions were drawn from the above studies and experiments on MBE and the present invention was made by exploiting the advantages and excluding the disadvantages of MBE.

(1) While the V group component of the substrate can be effectively prevented from leaving the substrate by evaporating onto the substrate surface with V molecular beams of the type same as or different from that of V atoms in the substrate in the step of cleaning the substrate, a transition layer is apt to be formed on the interface of the substrate and the crystal, if the pressure $P_1$ of V molecular beams is too high.

(2) While impurities are quickly removed from the substrate surface, if group III stabilized surfaces are present on the substrate surface in the step of cleaning the substrate, they are removed only very slowly from the substrate surface, if the group V stabilized surfaces are present on the substrate surface. (3) High substrate temperature $T_1$ is required to make III stabilized planes appear on the substrate surface and consequently the substrate surface is remarkably damaged by heat, if the pressure $P_1$ of molecular beams is raised in the step of cleaning the substrate.

(4) The substrate is remarkably damaged due to the partial breakaway of the V component of the substrate, if the substrate temperature $T_1$ exceeds $T_2 + 50°$ C., where $T_2$ is the V-III transition temperature (the transition temperature from V stabilized planes to the group III stabilized surfaces), whereas the breakaway of the V component is remarkably reduced if the substrate temperature $T_1$ does not exceed $T_2+50°$ C.

(5) When an oxide is deposited on the substrate in the form of polycrystal and the polycrystal shows a halo pattern or $1\times 1$ pattern image, if viewed through a reflection high-energy electron diffractor (RHEED), InP atoms are irregularly deposited on the polycrystal by eavaporating III atoms onto the polycrystal.

(6) When the substrate surface shows the group V stabilized surfaces and is evaporated onto with III atoms, a chemical reaction takes place on the substrate surface to alter the composition of the oxide film and make the oxide easily leave the substrate at low temperature. As the oxide film abruptly breaks away from the substrate surface, the group III surfaces that are smooth to atomic dimensions appear on the substrate surface.

(7) If the substrate surface is evaporated onto with III atoms while the substrate shows III planes, they are deposited excessively on the substrate surface to make the surface poorly plane.

(8) Neither impurities nor a transition layer are formed in the interface of the substrate and the crystal and high quality crystal is formed on the substrate in the step of crystal growth, if a III-V compound semiconductor is deposited and made to grow on the substrate surface after the operation of the above (6) is carried out.

(9) III stabilized planes appear on the substrate surface at lower temperature, if the operation of the above (6) is carried out.

(10) Impurities such as oxygen and carbon are scarcely found in the group III stabilized surfaces that appear on the substrate after the operation of the above (6) is carried out.

Now, the present invention will be described by referring to the accompanying drawings that illustrate a preferred embodiment of the invention.

DETAILED DESCRIPTION OF THE INVENTION

Figure 1:
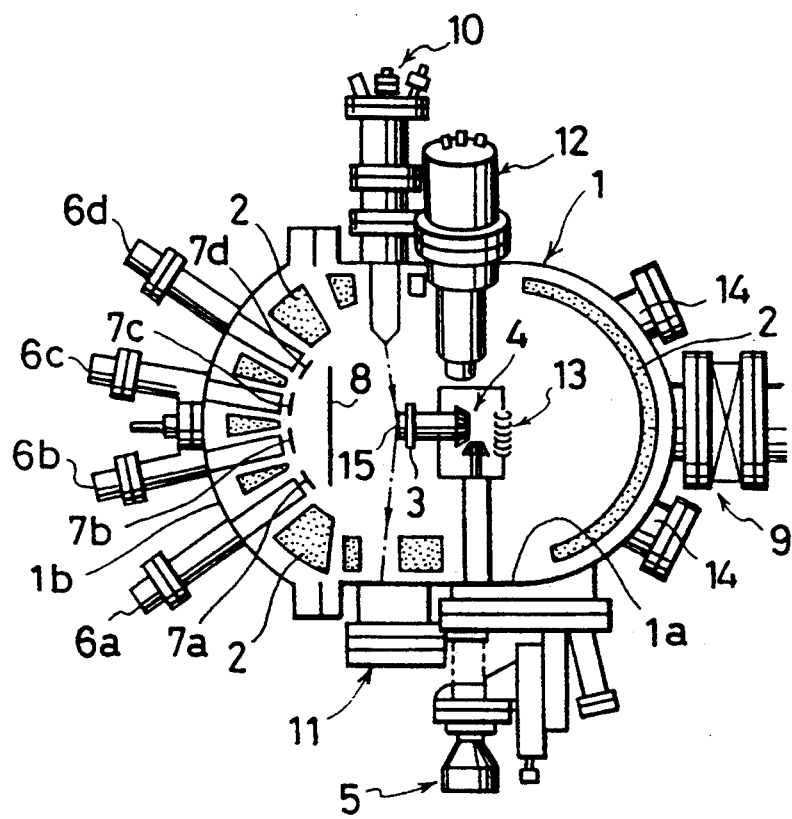
FIG. 1 is schematic sectional view of a molecular beams epitaxy apparatus that can be suitably used for the method of manufacturing a compound semiconductor according to the invention.

FIG. 1 schematically illustrates a molecular beams epitaxy apparatus to be suitably used for the purpose of the present invention.

Referring to FIG. 1, it comprises a deposition chamber 1 which is an airtight pressure container having a container main body 1a and a lid 1b, both of which is provided on the inner wall surface with liquid nitrogen shrouds 2.

In FIG. 1, a substrate holder 3 is rotatably arranged at the center of the deposition chamber 1 and provided with a transmission system 4 for the rotation of the holder, which transmission system 4 is linked to a manipulator 5 running through the wall of the container main body 1a. The substrate holder 3 is equipped with an electric heater (not shown) that can be remotely controlled from the manipulator side 5.

The deposition chamber 1 is provided on the side of the lid 1b thereof with a plurality of molecular beam source cells 6a through 6d running from the outside of the wall of the lid 1b into the inside of the deposition chamber 1 and directed toward the substrate holder 3.

The molecular beam source cells 6a through 6d are provided at the front ends thereof with respective shutters 7a through 7d for individually blocking the beams emitted from the cells, while a main shutter 8 is arranged between the shutters 7a through 7d and the substrate holder 3 in order to collectively block the beams coming from the cells.

The container main body 1a of the deposition chamber 1 is provided with a gate valve 9 linked to a substrate preparatory chamber (not shown), which is by turn linked to a substrate feed chamber (not shown).

Referring further to FIG. 1, the container main body 1a is provided with a reflection high energy electron diffractor (RHEED) 10 and a fluorescent screen 11 to be used with the RHEED, said diffractor and said screen being oppositely arranged on the wall of the container main body 1a with their front ends located at respective corresponding positions relative to the substrate holder 3 within the deposition chamber 1. The container main body 1a is also provided on the wall thereof with a quadruple pole type mass analyzing device (QMS), whose front end is also located in the container main body 1a of the deposition chamber 1.

In FIG. 1, reference numerals 14 and 14 denote an eyehole and a substrate secured by the substrate holder 3, respectively.

The method of the present invention using a molecular beams epitaxy apparatus as shown in FIG. 1 will now be described by way of an example where InAlAs crystal is made to grow on an InP substrate.

Beam source materials for generating In-, Al- and As molecular beams are stored in respective ones of the molecular beam source cells 6a through 6d and heated to the respective sublimation or evaporation temperatures of molecular beams. Assume here that the In-, Al- and As source materials are stored respectively in the molecular beam source cells 6a, 6b and 6c.

The InP substrate 15 is fed from the substrate feed chamber into the substrate preparatory chamber, where it is heated to remove any moisture thereof. Then, it is fed from the substrate preparatory chamber into the deposition chamber 1 and secured by the substrate holder 3. The inside of the deposition chamber 1 containing the InP substrate 15 is held in a supervacuum condition where no impurities are found.

In the step of cleaning the InP substrate 15, As molecular beams are used to clean the substrate because they can effectively prevent P atoms from leaving the InP substrate 15.

The pressure of As molecular beams emitted from the molecular beams source cell 6c is controlled by regulating the temperature of the molecular beams source cell 6c and mechanically controlling the shutter 7c located at the front end of the molecular beams source cell 6c.

If the III or V stabilized surfaces are present on the substrate surface in the cleaning step is determined by electron diffraction analysis using the reflection high energy electron diffractor 10 and the fluorescent screen 11. The surface of the substrate 15 being cleaned is observed through a scan type electron microscope.

Figure 2:
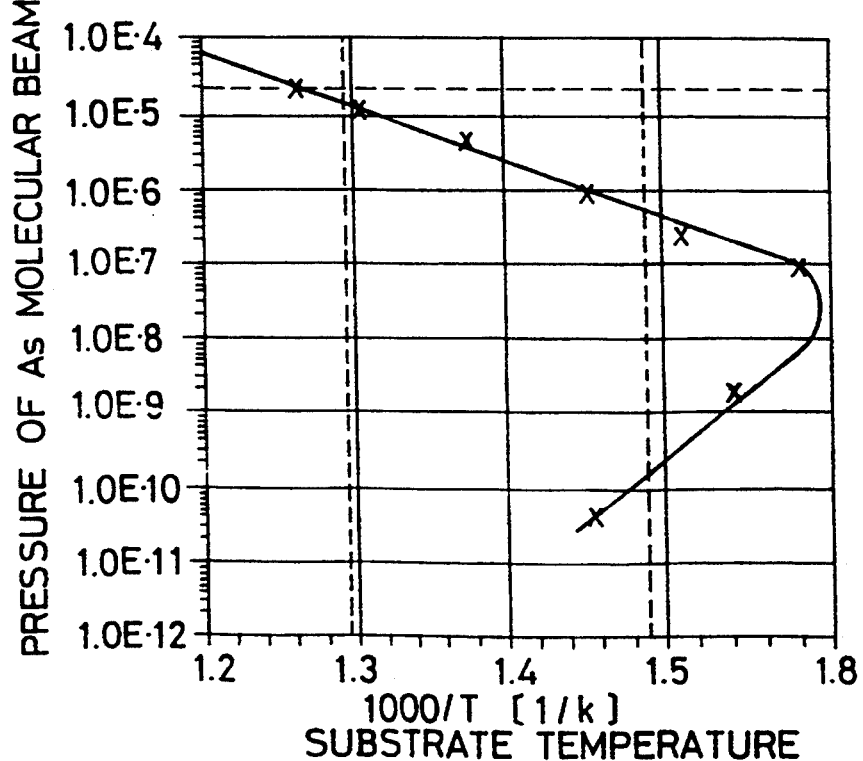
FIG. 2 is a graph showing the relationship between the pressure of As molecular beams on an InP substrate and the V-III transition temperature that is typically observed in a process of manufacturing a compound-semiconductor, using the method of the present invention.

FIG. 2 is a graph shows the relationship between the pressure of As molecular beams evaporated onto the surface of an InP substrate 15 and the temperature of the substrate in the step of cleaning the substrate obtained as a result of an experiment (ordinate: As molecular beam pressure, abcissa: V-III transition temperature of substrate).

In FIG. 2, each cross indicates the V-III transition temperature observed for a given pressure of As molecular beams. The observed temperatures are then plotted to produce a solid curve.

As may be understood from FIG. 2, the surface of an InP substrate 15 shows the group V stabilized surfaces at temperature below the solid line (in lower temperature zone) of FIG. 2, whereas it produces III stabilized plane at temperature above the solid line (in higher temperature zone) of FIG. 2.

When the pressure of As molecular beams is found between $1 \times 10^{-5}$ to $1 \times 10^{-7}$ Torr, the V-III transition temperature falls substantially linearly with the decrease in the pressure of As molecular beams. The substrate surface obtained after the cleaning step does not show any coarseness nor the electric characteristics of the crystal obtained after the crystal growth step reveal any degradation, if it is treated within the above defined pressure range. While the surface of the InP substrate rapidly becomes to show InAs having a lattice constant remarkably differentiated from that of InP, if the pressure of As molecular beams is high, such a phenomenon is advantageously suppressed as long as the pressure of As molecular beams is found within the range of $1 \times 10^{-6}$ to $1 \times 10^{-7}$ Torr.

If the pressure of As molecular beams is lower than $1 \times 10^{-7}$ Torr, the V-III transition temperature is shifted from the straight line toward the higher temperature side. This is because P atoms vigorously leave the InP substrate 15 when the pressure of As molecular beams is lower than $1 \times 10^{-7}$ Torr to modify the transition requirements of the substrate surface. If such is the case, the substrate surface shows substantially coarseness after the cleaning step.

If, on the other hand, the pressure of As molecular beams exceeds $1 \times 10^{-5}$, a buffer is apt to be formed in the interface of the substrate and the crystal grown on it to degrade the electric characteristics of the crystal, because P atoms in the substrate are encouraged to move away and replaced by As atoms.

This is the reason why the pressure $P_1$ of As molecular beams is held between $1 \times 10^{-5}$ and $1 \times 10^{-7}$ Torr and preferably between $1 \times 10^{-6}$ and $1 \times 10^{-7}$ Torr in the step of substrate cleaning.

The III stabilized surfaces need to be formed on the substrate surface in order to completely remove impurities from the substrate surface. This can be achieved under the condition where the surface temperature of the InP substrate 15 is equal to or higher than 500° C., if the pressure of As molecular beams is $1 \times 10^{-5}$ and equal to or higher than 350° C., if the pressure of As molecular beams is $1 \times 10^{-7}$ Torr. However, $T_1$ should be held under the critical temperature (V-III transition temperature $T_2+500°$ C.), because, as described above, P atoms can easily leave the substrate to degrade the smoothness of the substrate surface, if the surface temperature $T_1$ exceeds the critical temperature.

Thus, the surface temperature $T_1$ needs to meet the requirement of $T_2 \leq T_1 \leq (T_2 + 50°$ C.) in order to effectively remove impurities from the substrate surface without degrading its smoothness.

Now, the present invention will be described by way of examples.

EXAMPLE 1

An InAlAs crystal was made to grow on an InP substrate.

In the substrate cleaning step for cleaning the substrate surface by evaporating molecular beams while heating the substrate in a supervacuum condition, the pressure $P_1$ of As molecular beams emitted from the molecular beam source cell was made equal to $1 \times 10^{-5}$ Torr and the substrate was heated to raise its temperature at a rate of 30° C./min. while evaporating the substrate surface with As molecular beams.

It was then observed that the group III stabilized surfaces appeared on the substrate surface when the surface temperature $T_1$ of the InP substrate got to 420° C.

Thereafter, the substrate was heated continuously at the above described rate until the surface temperature $T_1$ of the InP substrate reached 440° C., when the heating was terminated and the substrate was held to that temperature for two (2) minutes.

After the end of the heating and the elapse of two (2) minutes, the substrate surface was observed by means of an electron diffractor and an electron microscope to find that the surface of the InP substrate was very smooth without any coarseness that can be produced by P atoms leaving the substrate surface.

In the subsequent crystal growth step following the substrate cleaning step, the pressure of As molecular beams emitted from the molecular beam source cell was raised to $2 \times 10^{-5}$ Torr and the remaining two molecular beam source cells were opened to allow InP and Al molecular beams to irradiate the substrate surface along with As molecular beams by opening the shutter as soon as the above pressure of As molecular beams was obtained in order to deposit and grow InAlAs crystal on the InP substrate.

The obtained InAlAs crystal was then observed by means of a SIMS (secondary ion mass spectroscope) and an X-ray diffractor.

As a result of the observation through a SIMS, it was found that practically no impurities existed in the InAlAs crystal. In other words, the impurity content level of the InAlAs crystal of Example 1 was lower than a 200th of that of any InAlAs crystal that can be produced by conventional MBE. Additionally, as a result of the observation through an X-ray diffractor, it was found that the compound substrate obtained in Example 1 carried no buffer layer between the InP substrate and the crystal and had an excellent potential barrier.

EXAMPLE 2

In this example, an InAlAs crystal was also made to grow on an InP substrate.

In the substrate cleaning step for cleaning the substrate surface by evaporating molecular beams while heating the substrate in a supervacuum condition, the pressure $P_1$ of As molecular beams emitted from the molecular beam source cell was made equal to $1 \times 10^{-7}$ Torr and the substrate was heated to raise its temperature at a rate of 35° C./min. while evaporating the substrate surface with As molecular beams.

It was then observed that the group III stabilized surfaces appeared on the substrate surface when the surface temperature $T_1$ of the InP substrate got to 350° C.

Thereafter, the substrate was heated continuously at the above described rate until the surface temperature $T_1$ of the InP substrate reached 400° C., when the heating was terminated and the substrate was held to that temperature for five (5) minutes.

After the end of the heating and the elapse of five (5) minutes, the substrate surface was observed by means of an electron diffractor and an electron microscope to find that the surface of the InP substrate was very smooth without any coarseness that can be produced by P atoms leaving the substrate surface.

In the subsequent crystal growth step following the substrate cleaning step, InAlAs crystal was made to be deposited and grow on the InP substrate as in the case of Example 1 above.

When the InAlAs crystal obtained in Example 2 was observed as in the case of Example 1, it was found that impurities had been almost completely removed from the crystal, which carried an excellent potential barrier as that of Example 1.

EXAMPLE 3

In this example, an InAlAs crystal was also made to grow on an InP substrate.

In the substrate cleaning step for cleaning the substrate surface by evaporating molecular beams while heating the substrate in a supervacuum condition, the pressure $P_1$ of As molecular beams emitted from the molecular beam source cell was made equal to $5 \times 10^{-7}$ Torr by operating the shutter and the substrate was heated to raise its temperature at a rate of 30° C./min. while evaporating the substrate surface with As molecular beams.

It was then observed that the group III stabilized surfaces appeared on the substrate surface when the surface temperature $T_1$ of the InP substrate got to 300° C.

Thereafter, the substrate was heated continuously at the above described rate until the surface temperature $T_1$ of the InP substrate reached 360° C. when molecular beams of $In_3$ which is an element of the III group, were evaporated onto the substrate surface for two (2) seconds to find that the oxide film abruptly broke away from the substrate surface to produce the III stabilized surfaces on the substrate surface when observed through a quadruple pole type mass analyzer (QMS) and a reflection high-energy electron diffractor (RHEED).

On the other hand, it was found that the group III stabilized surfaces appeared on the substrate surface, when the surface temperature $T_1$ of the InP substrate reached 395° C., if the irradiation of In molecular beams onto the substrate surface.

The operation of heating the substrate was terminated when the III stabilized surfaces appeared on the substrate surface and the substrate surface was observed by means of an electron diffractor and an electron microscope to find that the surface of the InP substrate was very smooth without any coarseness that can be produced by P atoms leaving the substrate surface.

In the subsequent crystal growth step following the substrate cleaning step, InAlAs crystal was made to be deposited and grow on the Inp substrate as in the case of Example 1 above.

When the InAlAs crystal obtained in Example 3 was observed as in the case of Example 1, it was found that impurities had been almost completely removed from the crystal, which carried an excellent potential barrier as that of Example 1.

The method of manufacturing a compound according to the invention can be used in a same or similar manner when a compound semiconductor other than the one described above by way of embodiment and examples is deposited and made to grow on a III-V substrate other than the one described above by way of embodiment and examples. Such a compound semiconductor may be selected from InGaAlAs and InGaAlSb while such a substrate may be made of a material selected from InAs, InSb, GaP, GaAs, GaSb, AlAs, AlSb and InGaAs.

As described above in detail, a method of manufacturing a compound semiconductor by means of molecular beams epitaxy (MBE) according to the invention can produce a clean and very smooth substrate surface and eliminate any impurities between the substrate and the crystal formed thereon. Additionally, it effective prevents a buffer layer from forming in the initial stages of crystal growth. Thus, it can manufacture high quality compund semiconductors on a reliable basis.

What is claimed is:

1. A method of manufacturing a compound semiconductor comprising steps of cleaning the surface of a substrate of a III-V compound by heating it and evaporating onto it with molecular beams in a high vacuum atmosphere and depositing and growing crystal of a semiconductor substance on the surface of the substrate by evaporating onto the substrate with molecular beams containing component atoms of the semiconductor crystal to be formed in a high vacuum atmosphere, characterized in that the temperature of the substrate surface is raised by heating until stabilized group III surfaces appear on the substrate surface in said substrate cleaning step and that the substrate surface is evaporated onto said substrate cleaning step with V molecular beams that cannot be significantly deposited and that are used out of molecular beams to be used for the crystal growth step, said V molecular beams evaporating under a condition of $P_1 \leq (P_2 \times \frac{1}{2})$, where $P_1$ is the pressure of V molecular beams and $P_2$ is the pressure of molecular beams in the crystal growth step.

2. A method of manufacturing a compound semiconductor according to claim 1, wherein the surface temperature of the substrate is held under a condition of $T_2 \leq T_1 \leq (T_2 + 50° C.)$ in said substrate cleaning step while the substrate surface is evaporated onto with V molecular beams after the appearance of a group III stabilized surfaces on the substrate surface, where $T_1$ is the surface temperature of the substrate and $T_2$ is the transition temperature of the V stabilized surfaces to the group III stabi lized surfaces.

3. A method of manufacturing a compound semiconductor according to claim 1, wherein said substrate is an InP substrate and the surface temperature of the substrate is raised until group III stabilized surfaces appear on the substrate surface in said substrate cleaning step while evaporating onto the substrate surface with molecular beams containing As atoms and held toa pressure of $1 \times 10^{-5}$ to $1 \times 10^{-7}$ Torr.

4. A method of manufacturing a compound semiconductor according to claim 3, wherein the surface temperature of the substrate is held under a condition of $T_2 \leq T_1 \leq (T_2 + 50° C.)$ in said substrate cleaning step while the substrate surface is eavaporating onto with V molecular beams contain-As atoms and held to a pressure of $1 \times 10^{-5}$ to $1 \times 10^{-7}$ Torr after the appearance of III stabilized surfaces on the substrate surface.

5. A method of manufacturing a compound semiconductor comprising steps of cleaning the surface of a substrate of a III-V compound by heating it and evaporating onto it with molecular beams in a high vacuum atmosphere and depositing and growing crystal of a semiconductor substance on the surface of the substrate by evaporating onto the substrate with molecular beams containing component atoms of the semiconductor crystal to be formed in a high vacuum atmosphere, characterized in that the substrate surface is irradiated with III molecular beams of III atoms as a component of the substrate after the appearance of group V stabilized surfaces on the substrate semiconductor and before the appearance of group III stabilized surfaces in said cleaning step.

6. A method of manufacturing a compound semiconductor according to claim 5, wherein said substrate is an InP substrate and the substrate surface is irradiated with molecular beams containing As atoms and held to a pressure of $1 \times 10^{-5}$ to $1 \times 10^{-7}$ Torr while raising the surface temperature of the substrate until group V stabilized surfaces appear on the substrate surface in said substrate cleaning step, followed by evaporation of molecular beams containing In atoms onto the substrate surface even after the appearance of V stabilized surfaces on the substrate surface.

* * * * *